United States Patent [19]
Cooke et al.

[11] Patent Number: 5,966,534
[45] Date of Patent: Oct. 12, 1999

[54] METHOD FOR COMPILING HIGH LEVEL PROGRAMMING LANGUAGES INTO AN INTEGRATED PROCESSOR WITH RECONFIGURABLE LOGIC

[76] Inventors: Laurence H. Cooke, 25399 Spanish Ranch Rd., Los Gatos, Calif. 95030; Christopher E. Phillips, 5888 Assis Ct., San Jose, Calif. 95138; Dale Wong, 855 35th Ave., San Franciso, Calif. 94121

[21] Appl. No.: 08/884,377

[22] Filed: Jun. 27, 1997

[51] Int. Cl.$^6$ ........................................ G06F 9/44
[52] U.S. Cl. ............................................. 395/705
[58] Field of Search .................... 395/709, 705

[56] References Cited

U.S. PATENT DOCUMENTS

| | | | |
|---|---|---|---|
| 5,491,694 | 2/1996 | Oliver et al. | 370/455 |
| 5,511,067 | 4/1996 | Miller | 370/355 |
| 5,513,124 | 4/1996 | Trimberger et al. | 364/491 |
| 5,548,587 | 8/1996 | Bailey et al. | 370/395 |
| 5,603,063 | 2/1997 | Au | 710/52 |
| 5,625,797 | 4/1997 | Ferry et al. | 395/709 |
| 5,729,705 | 3/1998 | Weber | 710/128 |
| 5,752,035 | 5/1998 | Trimberger | 395/705 |
| 5,794,044 | 8/1998 | Yellin | 395/704 |
| 5,864,535 | 1/1999 | Basilco | 370/231 |

OTHER PUBLICATIONS

Hartmann, R., Combined Scheduling and Routing for Programmable ASIC, Mar. 16, 1992, pp. 486–490.

Masaynici, Y., A Method of Retargetable Compilation for Embedded Systems, 1997, pp. 85–92.

*Primary Examiner*—Tariq R. Hafiz
*Assistant Examiner*—John Q. Chavis
*Attorney, Agent, or Firm*—Burns, Doane, Swecker & Mathis, LLP

[57] ABSTRACT

A method is presented for automatically compiling a high level computer program down into an application specific integrated circuit coupled with a generic microprocessor. The original source code is written in a standard programming language such as ANSI C. Source code analysis is performed by our compiler to automatically determine which blocks of logic are most appropriate for the application specific integrated circuit and which for the generic microprocessor. The complete layout of the application specific integrated circuit is automatically generated by our compiler. Object code for the microprocessor, with custom instructions to invoke the application specific integrated circuit, is also automatically generated by our compiler.

51 Claims, 3 Drawing Sheets

```
/* finite impulse response filter */
for (j = 0; j < SAMPLES; j++)
{
    out[j] = 0;

/* inner loop */
    for (i = 0; i <FILTER_TAPS; i++)
    {
        out[j] += coeff[i] * sample[j + i];
    }
}
```

FIG._3

```
mult    coeff[registerA], sample[registerB], registerC
add     registerC, registerD
add     registerA, 1, registerA
add     registerB, 1, registerB
```

METHOD FOR COMPILING HIGH LEVEL PROGRAMMING LANGUAGES INTO AN INTEGRATED PROCESSOR WITH RECONFIGURABLE LOGIC

FIELD OF THE INVENTION

The present invention concerns the automatic translation of a computer program into an application specific integrated circuit. The computer program will execute significantly faster on the custom integrated circuit than it would on a generic microprocessor.

Traditionally, an integrated circuit must be designed by describing its structure with circuit primitives such as Boolean gates and registers. The circuit designer must begin with a specific application in mind, e.g. a video compression algorithm, and the resulting integrated circuit can only be used for the targeted application.

Alternatively, an integrated circuit may be designed as a general purpose microprocessor with a fixed instruction set, e.g. the Intel x86 processors. This allows flexibility in writing computer programs which can invoke arbitrary sequences of the microprocessor instructions. While this approach increases the flexibility, it decreases the performance since the circuitry cannot be optimized for any specific application.

It would be desirable for high level programmers to be able to write arbitrary computer programs and have them automatically translated into fast application specific integrated circuits. However, currently there is no bridge between the computer programmers, who have expertise in programming languages for microprocessors, and the application specific integrated circuits, which require expertise in circuit design.

DESCRIPTION OF THE RELATED ART

Research and development in integrated circuit design is attempting to push the level of circuit description to increasingly higher levels of abstraction. The current state of the art is the "behavioral synthesizer" whose input is a behavioral language description of the circuit's register/transfer behavior and whose output is a structural description of the circuit elements required to implement that behavior. The input description must have targeted a specific application and must describe its behavior in high level circuit primitives, but the behavioral compiler will automatically determine how many low level circuit primitives are required, how these primitives will be shared between different blocks of logic, and how the use of these primitives will be scheduled. The output description of these circuit primitives is then passed down to a "logic synthesizer" which maps the circuit primitives onto a library of available "cells", where each cell is the complete implementation of a circuit primitive on an integrated circuit. The output of the logic synthesizer is a description of all the required cells and their interconnections. This description is then passed down to a "placer and router" which determines the detailed layout of all the cells and interconnections on the integrated circuit.

On the other hand, research and development in computer programming is also attempting to push down a level of abstraction by matching the specific application programs with custom targeted hardware. One such attempt is the Intel MMX instruction set. This instruction set was designed specifically to accelerate applications with digital signal processing algorithms. Such applications may be written generically and an MMX aware compiler will automatically accelerate the compiled code by using the special instructions. Another attempt to match the application with appropriate hardware is the work on parallelizing compilers. These compilers will take a computer program written in a sequential programming language and automatically extract the implicit parallelism which can then be targeted for execution on a variable number of processors. Thus different applications may execute on a different number of processors, depending on their particular needs.

Despite the above efforts by both the hardware and software communities, the gap has not yet been bridged between high level programming languages and integrated circuit behavioral descriptions.

One existing company has made marketing claims that their product can compile a proprietary "C-like" language into the company's application specific coprocessors. However, the C-like aspects of their language only pertain to the syntax, not the semantics. The semantics are actually very similar to the existing circuit description languages which are input into today's logic synthesizers.

BRIEF SUMMARY OF THE INVENTION

A computer program, written in a high level programming language, is compiled into an intermediate data structure which represents its control and data flow. This data structure is analyzed to identify critical blocks of logic which can be implemented as an application specific integrated circuit to improve the overall performance. The critical blocks of logic are first transformed into new equivalent logic with maximal data parallelism. The new parallelized logic is then translated into a Boolean gate representation which is suitable for implementation on an application specific integrated circuit. The application specific integrated circuit is coupled with a generic microprocessor via custom instructions for the microprocessor. The original computer program is then compiled into object code with the new expanded target instruction set.

DETAILED DESCRIPTION OF INVENTION

Figure 1:
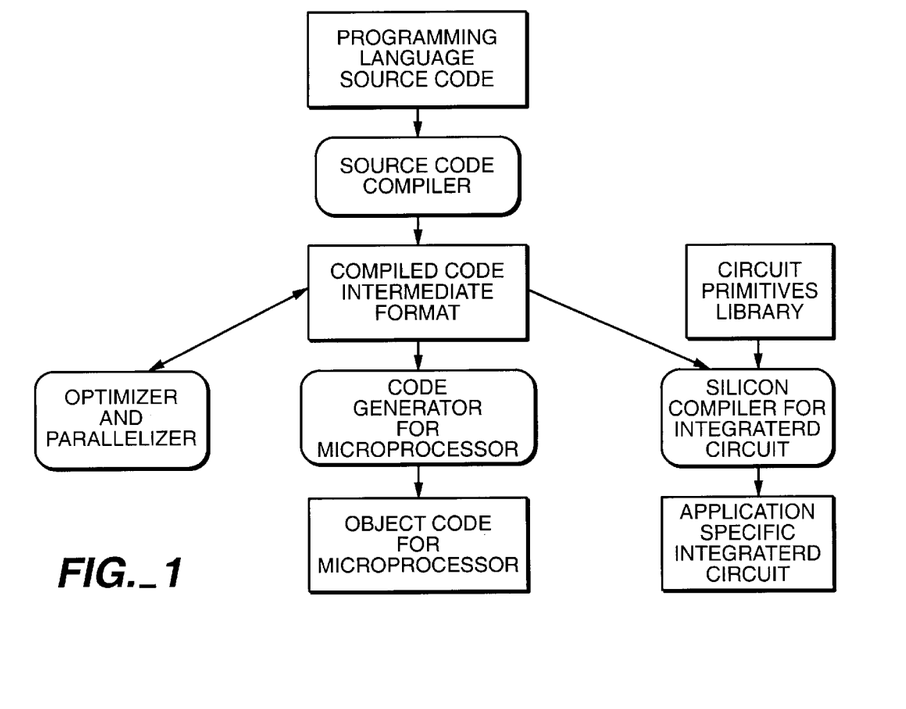
FIG. 1 shows the design methodology flow diagram of the preferred embodiment of our compiler.
Figure 2:
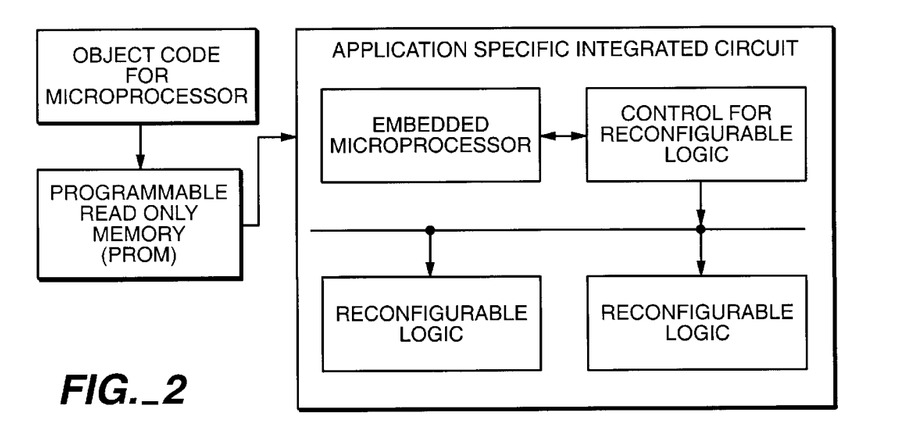
FIG. 2 shows the control flow for the operation of the preferred embodiment of our application specific integrated circuit.
Figure 3:
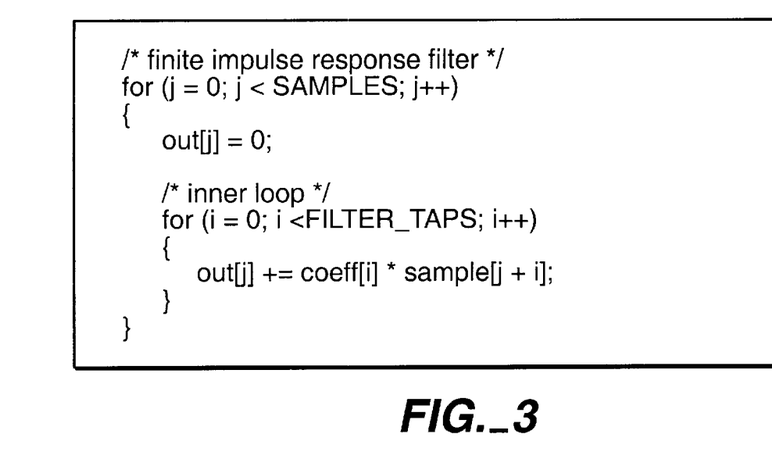
FIG. 3 shows a fragment of a high level source code example which can be input into our compiler.
Figure 4:
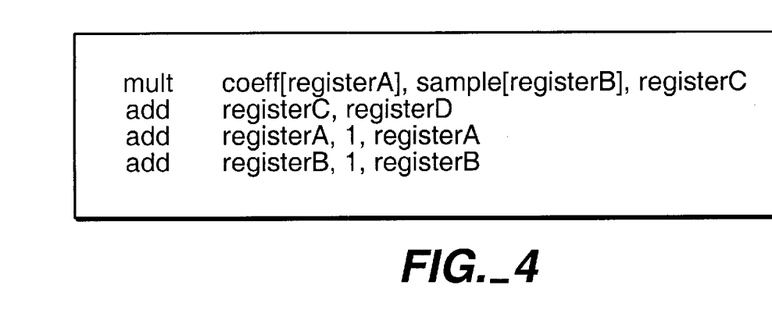
FIG. 4 shows the microprocessor object code for the code example of FIG. 3 which would be output by a standard compiler.
Figure 5:
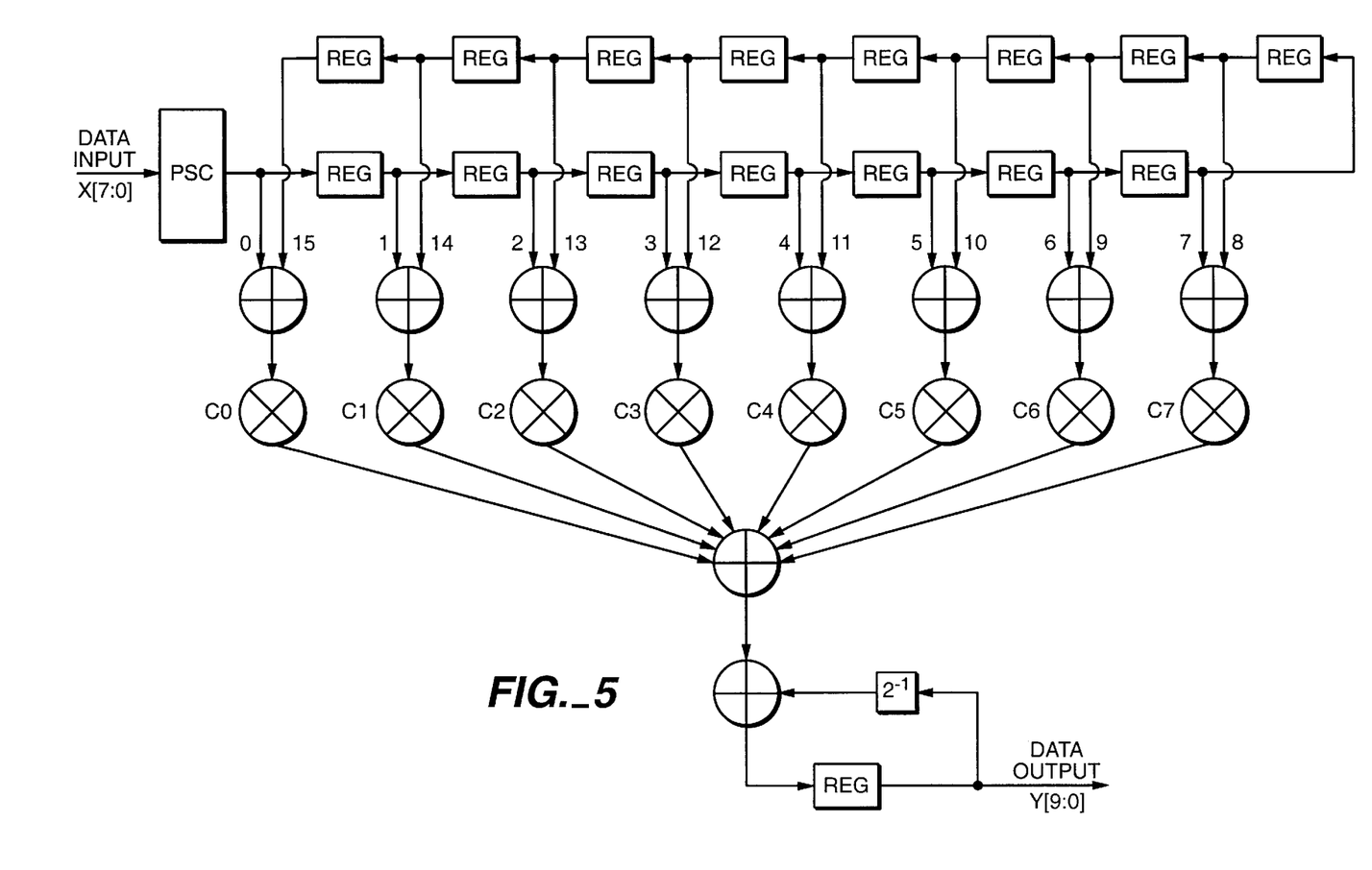
FIG. 5 shows an example of the application specific circuitry which is output by our compiler for the code example of FIG. 3.

In accordance with the preferred embodiment of the present invention, a method is presented for automatically compiling high level programming languages into application specific integrated circuits (ASIC).

The computer program source code is parsed with standard compiler technology into a language independent intermediate format. The intermediate format is a standard control and data flow graph, but with the addition of constructs to capture loops, conditional statements, and array accesses. The format's operators are language independent simple RISC-like instructions, but with additional operators for array accesses and procedure calls. These constructs capture all the high level information necessary for parallelization of the code. For further description of a compiled intermediate format see for example S. P. Amarasinghe, J. M. Anderson, C. S. Wilson, S.-W. Liao, B. M. Murphy, R. S. French, M. S. Lam and M. W. Hall; Multiprocessors from a Software Perspective; IEEE Micro, June 1996; pages 52–61.

Because standard compiler technology is used, the input computer program can be any legal source code for a supported high level programming language. Our methodology does not require a special language with constructs specifically for describing hardware implementation elements. Front end parsers currently exist for ANSI C and FORTRAN 77 and other languages can be supported simply by adding new front end parsers. For further information on front end parsers see for example C. W. Fraser and D. R. Hanson; A Retargetable Compiler for ANSI C; SIGPLAN Notices, 26(10); October 1991.

From the intermediate format, our methodology uniquely supports code generation for two different types of target hardware: standard microprocessor and ASIC. Both targets are needed because while the ASIC is much faster than the microprocessor, it is also much larger and more expensive and therefore needs to be treated as a scarce resource. Our compiler will estimate the performance versus area tradeoffs and automatically determine which code blocks should be targeted for a given available ASIC area.

Code generation for the microprocessor is handled by standard compiler technology. A code generator for the MIPS microprocessor currently exists and other microprocessors can be supported by simply adding new back end generators. In the generated object code, custom instructions are inserted which invoke the ASIC implemented logic as coprocessor instructions.

The special instructions are in four general categories: load_configuration, activate_configuration, invoke_configuration, release_configuration. The load_configuration instruction identifies the address of a fixed bit stream which can configure the logic and interconnect for a single block of reconfigurable logic on the ASIC. The ASIC may have one or more such blocks on a single chip. The identified bit stream may reside in, for example, random access memory (RAM) or programmable-read-only-memory (PROM). The bit stream is downloaded to a register cache of possible block configurations on the ASIC. The activate_configuration instruction identifies a previously downloaded configuration, restructures the reconfigurable logic on the ASIC block according to that configuration, and locks the block from any subsequent activate instructions. The invoke_configuration instruction loads the input operand registers, locks the output registers, and invokes the configured logic on the ASIC. After the ASIC loads the results into the instruction's output registers, it unlocks the registers and the microprocessor can take the results and continue execution. The release_configuration instruction unlocks the ASIC block and makes it available for subsequent activate_configuration instructions. For further description of an embedded microprocessor with reconfigurable logic see the patent application of L. Cooke, C. Phillips, and D. Wong for An Integrated Processor and Programmable Data Path Chip for Reconfigurable Computing.

Code generation for the ASIC logic can be implemented by several methods. One implementation passes the intermediate control and data flow graphs to a behavioral synthesis program. This interface could be accomplished either by passing the data structures directly or by generating an intermediate behavioral language description. For further discussion of behavioral synthesis see for example D. Knapp; Behavioral Synthesis; Prentice Hall PTR, 1996. An alternative implementation generates one-to-one mappings of the intermediate format primitives onto a library of circuit implementations. For example: scalar variables and arrays are implemented as registers and register files with appropriate bit widths; arithmetic and Boolean operators such as add, multiply, accumulate, and compare are implemented as single cells with appropriate bit widths; conditional branch implementations and loops are implemented as state machines. For further discussion of techniques for state machine synthesis see for example G. De Micheli, A. Sangiovanni-Vincentelli, and P. Antognetti; Design Systems for VLSI Circuits; Martinus Nijhoff Publishers; 1987; pp. 327–364.

The basic unit of code that would be targeted for an ASIC is a loop. The intermediate format for a single loop is mapped bottom-up hierarchically and an equivalent list of cells and their interconnections is generated. This list is commonly referred to as a netlist. This netlist is then passed to a placer and router which determines the actual layout of the cells and their interconnections on an ASIC. The complete layout is then encoded and compressed in a bit stream format which can be stored and loaded as a single unit to configure the ASIC. For a general discussion of place and route algorithms see T. Ohtsuki; Layout Design and Verification; North-Holland; 1986; pp. 55–198.

A single loop in the input source code may be transformed in the intermediate format into multiple constructs for runtime optimization and parallelization. The degree of loop transformation for parallel execution is a key factor in improving the performance of the ASIC versus a microprocessor. These transformations are handled by standard parallelizing compiler technology which includes constant propagation, forward propagation, induction variable detection, constant folding, scalar privatization analysis, loop interchange, skewing, and reversal. For a general discussion of parallel compiler loop transformations see Michael Wolfe; High Performance Compilers for Parallel Computing; Addison-Wesley Publishing Company; 1996; pp. 307–363.

To determine which source code loops will yield the most relative performance improvement, the results of a standard source code profiler are input to our compiler. The profiler analysis indicates the percentage of runtime spent in each block of code. By combining these percentages with the amount of possible parallelization for each loop, we can estimate a figure of merit for the possible gain of each loop. For example:

$$Gain=(profilePercent)*(1-1 /parallelPaths)$$

where
profilePercent=percent of runtime spent in this loop
parallelPaths=number of paths which can be executed in parallel To determine the amount of ASIC area required to implement a source code loop, we sum the individual areas of all its mapped cells and estimate the additional area required to interconnect the cells. The size of the cells and their interconnect depends on the number bits needed to implement the required data precision. The ASIC area can serve as a figure of merit for the cost of each loop. For example:

$$Cost=cellArea+MAX(0, (interconnectArea-overTheCellArea))$$

where
cellArea=sum of all component cell areas
overTheCellArea=cellArea*(per cell area available for interconnects)
interconnectArea=(number of interconnects)*(interconnectlength)*(interconnect width)
interconnectLength=(square root of the number of cells)/3

For further information on estimating interconnect area see B. Preas, M. Lorenzetti; Physical Design Automation of VLSI Systems; Benjamin/Cummings Publishing Company; 1988; pp. 31–64.

Our method does not actually calculate the figures of merit for all the loops in the source code. The compiler is given two runtime parameters: the maximum area for a single ASIC block, and the maximum total ASIC area available, depending on the targeted runtime system. It first sorts the loops in descending order of their percentage of runtime, and then estimates the figures of merit for each loop until it reaches a predetermined limit in the total amount of area estimated. The predetermined limit is a constant times the maximum total ASIC area available. Loops that require an area larger than a single ASIC block are skipped. Finally, with all the loops for which we have calculated figures of merit, we apply a knapsack algorithm to select the loops. This procedure can be trivially extended to handle the case of targeting multiple ASIC's if there is no gain or cost associated with being in different ASIC's. For a general discussion of knapsack algorithms see Syslo, Deo, Kowalik; Discrete Optimization Algorithms; Prentice-Hall; 1983; pp. 118–176.

The various source code loops which are packed onto a single ASIC are generally independent of each other. With certain types of ASIC's, namely a field programmable gate array (FPGA), it is possible to change at runtime some or all of the functions on the FPGA. The FPGA has one or more independent blocks of reconfigurable logic. Each block may be reconfigured without affecting any other block. Changing which functions are currently implemented may be desirable as the computer program executes different areas of code, or when an entirely different computer program is loaded, or when the amount of available FPGA logic changes.

A reconfigurable FPGA environment presents the following problems for our compiler to solve: selecting the total set of functions to be implemented, partitioning the functions across multiple FPGA blocks, and scheduling the loading and activation of FPGA blocks during the program execution. These problems cannot be solved optimally in polynomial time. The following paragraphs describe some heuristics which can be successfully applied to these problems.

The set of configurations simultaneously coexisting on an FPGA at a single instant of time will be referred to as a snapshot. The various functions comprising a snapshot are partitioned into the separate blocks by the compiler in order to minimize the blocks' stall time and therefore minimize the overall execution schedule. A block will be stalled if the microprocessor has issued a new activate_configuration instruction, but all the functions of the previous configuration have not yet completed. The partitioning will group together functions that finish at close to the same time. All the functions which have been selected by the knapsack algorithm are sorted according to their ideal scheduled finish times (the ideal finish times assume that the blocks have been downloaded and activated without delay so that the functions can be invoked at their scheduled start times). Traversing the list by increasing finish times, each function is assigned to the same FPGA block until the FPGA block's area capacity is reached. When an FPGA block is filled, the next FPGA block is opened. After all functions have been assigned to FPGA blocks, we calculate for each FPGA block the difference between the earliest and the latest finish times. Then we revisit each function in reverse (decreasing) order. If reassigning the function to the next FPGA block does not exceed its area capacity and reduces the maximum of the two differences for the two FPGA blocks, then the function is reassigned to the next FPGA block.

After the functions are partitioned, each configuration of an FPGA block may be viewed as a single task. Its data and control dependencies are the union of its assigned functions' dependencies, and its required time is the difference between the latest finish time and the earliest start time of its assigned functions. The set of all such configuration tasks across all snapshots may be scheduled with standard multiprocessor scheduling algorithms, treating each physical FPGA block as a processor. This will schedule all the activate_configuration instructions.

A common scheduling algorithm is called list scheduling. In list scheduling, the following steps are a typical implementation:

1. Each node in the task graph is assigned a priority. The priority is defined as the length of the longest path from the starting point of the task graph to the node. A priority queue is initialized for ready tasks by inserting every task that has no immediate predecessors. Tasks are sorted in decreasing order of task priorities.
2. As long as the priority queue is not empty do the following:
   a. A task is obtained from the front of the queue.
   b. An idle processor is selected to run the task.
   c. When all the immediate predecessors of a particular task are executed, that successor is now ready and can be inserted into the priority queue.

For further information on multiprocessor scheduling algorithms see A. Zomaya; Parallel and Distributed Computing Handbook; McGraw-Hill; 1996; pp. 239–273.

All the load_configuration instructions may be issued at the beginning of the program if the total number of configurations for any FPGA block does not exceed the capacity of the FPGA block's configuration cache. Similarly, the program may be divided into more than one section, where the total number of configurations for any FPGA block does not exceed the capacity of the FPGA block's configuration cache. Alternatively, the load_configuration instructions may be scheduled at the lowest preceding branch point in the program's control flow graph which covers all the block's activate_configuration instructions. This will be referred to as a covering load instruction. This is a preliminary schedule for the load instructions, but will lead to stalls if the actual load time exceeds the time the microprocessor requires to go from the load_configuration instruction to the first activate_configuration instruction. In addition, the number of configurations for an FPGA block may still exceed the capacity of its configuration cache. This will again lead to stalls in the schedule. In such a case, the compiler will compare the length of the stall versus the estimated gains for each of the configurations in contention. The gain of a configuration is estimated as the sum of the gains of its assigned functions. Among all the configurations in contention, the one with the minimum estimated gain is found. If the stall is greater than the minimum gain, the configuration with the minimum gain will not be used at that point in the schedule.

When a covering load instruction is de-scheduled as above, tentative load_configuration tasks will be created just before each activate-configuration instruction. These will be created at the lowest branch point immediately preceding the activate instruction. These will be referred to as single load instructions. A new attempt will be made to schedule the single load command without exceeding the FPGA block's configuration cache capacity at that point in the schedule. Similarly to the previous scheduling attempt, if the number of configurations again exceeds the configuration cache capacity, the length of the stall will be compared to the estimated gains. In this case, however, the estimated gain of the configuration is just the gain of the single function which will be invoked down this branch. Again, if the stall is greater than the minimum gain, the configuration with the minimum gain will not be used at that point in the schedule.

If a de-scheduled load instruction is a covering load instruction, the process will recurse; otherwise if it is a single load instruction, the process terminates. This process can be generalized to shifting the load instructions down the control flow graph one step at a time and decreasing the number of invocations it must support. For a single step, partition each of the contending configurations into two new tasks. For the configurations which have already been scheduled, split the assigned functions into those which finish by the current time and those that don't. For the configuration which has not been scheduled yet, split the assigned functions into those which start after the stall time and those that don't. While certain preferred embodiments of the present invention have been disclosed in detail, it is to be understood that various modifications in its implementation may be adopted without departing from the spirit of the invention or the scope of the following claims.

We claim:

1. A computer implemented method for the automatic compilation of a computer program written in a high level programming language into a program for execution by one or more application specific integrated circuits coupled with a microprocessor, the method comprising the steps of:

using a cost function, automatically determining a set of one or more code blocks, the functions of which are to be executed by said one or more application specific integrated circuits, that will result in a relative performance improvement for a given input computer program written for execution by the microprocessor;

scheduling usage of physical resources, including reconfiguration resources, of said one or more application specific integrated circuits among at least some of said functions with the objective of maximizing utilization of said physical resources; and producing code for execution by the microprocessor, including instructions for loading and activating said functions.

2. The method of claim 1, further comprising:

grouping the code blocks into groups based on at least one of an area constraint and an execution timing constraint;

scheduling loading of said functions; and scheduling activation of said functions.

3. The method of claim 2, comprising the further step of producing detailed integrated circuit layouts of said circuitry.

4. The method of claim 2, comprising the further step of producing configuration data for said functions.

5. The method of claim 1, wherein said instructions include special instructions to load, activate, invoke and/or release functions implemented on an application specific integrated circuit.

6. The method of claim 1, wherein grouping comprises calculating start and finish times for the selected blocks of code.

7. The method of claim 5, wherein the start and finish times are calculated assuming that the selected code blocks are implemented in parallel with a fixed overhead for each parallel operation.

8. The method of claim 6, wherein the fixed overhead is calculated as $OV=I+A+L$, where I is an average time required to invoke the application specific integrated circuit as a coprocessor instruction; A is an average time required to issue an activate configuration instructions plus an average stall time for activation; and L is an average time required to issue a load configuration instruction plus an average stall time for loading.

9. The method of claim 5, wherein grouping is performed such that a difference between the latest and earliest finish times within a group is minimized.

10. The method of claim 5, wherein grouping is performed such that for each group, circuitry for performing the functions of that group does not exceed a specified capacity of a block of an application integrated circuit.

11. The method of claim 5, wherein grouping further comprises:

opening a new group with a total assigned area of zero;

sorting and traversing the code blocks in a predetermined order;

for each code block, if the area of the block plus the group's assigned area does not exceed a specified maximum area for a single group, adding the code block to the group and adding the area of the code block to the group's assigned area; otherwise, opening a new group, adding the code block to the new group and adding the area of the code block to the new group's assigned area.

12. The method of claim 10, wherein said predetermined order is in increasing order of finish times as a primary key, and increasing order of start times as a secondary key.

13. The method of claim 11, wherein grouping comprises the further steps of:

traversing the code blocks in decreasing order of finish times;

for each code block, determining a start spread and finish spread of a group to which the code block belongs, wherein the start spread is the difference between the latest and earliest start times of all of the code blocks belonging to the same group, and the finish spread is the difference between the latest and earliest finish times of all of the code blocks belonging to the same group; and reassigning the code block to a different group if the code block's area plus the different group's assigned area does not exceed the specified maximum area for a single group, and if reassigning the code block results in a net improvement in at least one of start spread and finish spread for the group to which the code block belongs and the different group.

14. The method of claim 1, wherein selecting comprises sampling the percentage of time spent in each block of code when the computer program is executed on a single microprocessor.

15. The method of claim 13, wherein selecting further comprises:

parsing the high level programming language into an intermediate data structure representing control and data dependencies of the computer program; and analyzing the amount of implicit parallelism in the intermediate data structure.

16. The method of claim 14, wherein selecting further comprises, for at least some of the code blocks of the computer program, estimating the cost and benefit of implementing a code block using circuitry within an application specific integrated circuit.

17. The method of claim 15, wherein estimating the cost and benefit of implementing a code block comprises:
   estimating a reduction in execution time if the code block is implemented as an application specific integrated circuit; and
   estimating a layout area required if the code block is implemented as an application specific integrated circuit.

18. The method of claim 16, wherein selecting further comprises:
   accepting a first runtime parameter representing a maximum area of a single block of an application specific integrated circuit and a second runtime parameter representing a maximum total area for all blocks to be considered for implementation as application specific integrated circuits; and
   selecting a set of code blocks which satisfies the first and second runtime parameters and which maximizes a total estimated reduction in execution time.

19. The method of claim 17, wherein selecting a set of code blocks which satisfies the first and second runtime parameters and which maximizes a total estimated reduction in execution time comprises:
   sorting and traversing the code blocks in decreasing order of reduction in execution time; and
   for each code block:
      if the reduction equals zero, terminate;
      estimate the required layout area;
      if the area exceeds the specified maximum area for a single block of an application specific integrated circuit, skip this code block;
      multiplying the specified maximum total area for all blocks by a constant greater than one;
      if a total area of previously selected code blocks plus an estimated required layout area for a current code block exceeds the specified maximum total multiplied by the constant, terminate;
      otherwise, select the code block; and
      using a knapsack algorithm and the maximum total area to perform a further selection on the selected code blocks.

20. The method of claim 16, wherein the reduction in execution time is estimated in accordance with the formula $R=T(1-1/P)$ where T is a percentage of execution time spent in the code block and P is a number of paths which can be executed in parallel in the code block.

21. The method of claim 16, wherein the intermediate data structure is a tree structure containing nodes, and estimating the layout area comprises:
   performing bottom-up traversal of the tree structure;
   mapping each node in the tree to a cell from a library of circuit primitives;
   calculating a total area of the mapped cells; and
   calculating an additional area required for cell interconnections.

22. The method of claim 20, wherein mapping is performed in accordance with multiple predetermined mappings including at least one of the following: scalar variables map to registers; arrays map to register files; addition and subtraction operators map to adders; increment and decrement operators map to adders; multiplications and division operators map to multipliers; equality and inequality operators map to comparators; +=, -= operators map to accumulators; *=, /= operators map to multiply-accumulators, <<, >> operators map to shift registers; &, |, ~, ^, operators map to boolean gates, branches map to a state machine, and loops map to a state machine.

23. The method of claim 20, wherein mapping includes determining a number of significant bits required to support a data precision expected by the computer program.

24. The method of claim 20, wherein calculating an additional area required for interconnections is performed in accordance with the following formula: area=max(0, (A–B)) where A is an estimate of total area required for interconnections and B is an estimate of area available within the mapped cells for use by interconnections.

25. The method of claim 23, wherein A is calculated as the product of a runtime parameter for the width of an interconnection, an average length of an interconnection calculated as a fraction times the square root of the number of mapped cells, and the total number of interconnections.

26. The method of claim 23, wherein B is calculated as the product of a runtime parameter for the fraction of cell area for interconnections and the total area of all of the mapped cells.

27. The method of claim 14, comprising the further step of estimating a reduction in execution time for each group.

28. The method of claim 26, wherein scheduling activation is performed such that overall execution time is minimized subject to at least one of an area constraint and an execution time constraint.

29. The method of claim 27, wherein scheduling activation is performed such that data and control dependencies of all code blocks within a group are not violated.

30. The method of claim 27, wherein scheduling activation is performed such that a specified number of simultaneous blocks of an application specific circuit is not exceeded.

31. The method of claim 27, wherein scheduling further comprises:
   modeling each group as a separate task;
   modeling as a processor each available block of reconfigurable logic on an application specific integrated circuit; and
   running a modified multiprocessor scheduling algorithm.

32. The method of claim 30, wherein the intermediate data structure is a graph in which arcs represent dependencies, and wherein modeling each group as a separate task comprises:
   for each group, adding a node to the graph;
   for each code block assigned to a group, modifying the graph such that arcs that previously pointed to the code block point instead to a node representing the group;
   determining a difference between a latest finish time and an earliest start time of code blocks assigned to the group; and
   setting a required time of the group equal to said difference.

33. The method of claim 30, wherein running a modified multiprocessor scheduling algorithm comprises:
   running a standard list scheduling multiprocessor scheduling algorithm;
   during running of the algorithm, in the event no processor is available when a newly-ready task becomes ready:

calculating a stall time until a processor would become available;

create a list of contending tasks including the newly-ready task and tasks scheduled to be executing at a time the newly-ready task becomes ready; and finding a contending task with a minimum estimated reduction in execution time.

34. The method of claim 32, wherein running the modified multiprocessor scheduling algorithm further comprises:

if the stall time is less than or equal to the minimum reduction, scheduling the newly-ready task to execute when a processor becomes available and continuing to run the multiprocessor scheduling algorithm.

35. The method of claim 33, wherein running the modified multiprocessor scheduling algorithm further comprises, if the stall time is greater than the minimum reduction, discarding the task with the minimum reduction and continuing to run the multiprocessor scheduling algorithm.

36. The method of claim 33, wherein running the modified multiprocessor scheduling algorithm further comprises, if the stall time is greater than the minimum reduction:

replacing the newly-ready task with two new tasks, a first new task containing code blocks of the newly-ready task having start times later than when a processor would become available, and a second new task containing other code blocks of the newly-ready task;

replacing respective tasks scheduled to be executing at a time the newly-ready task becomes ready with two new respective tasks, a first new task containing code blocks of the newly-ready task having start times later than when a processor would become available, and a second new task containing other code blocks of the newly-ready task.

37. The method of claim 35, wherein running the modified multiprocessor scheduling algorithm further comprises:

of the new tasks, finding a task with a minimum reduction in execution time; and discarding the task with the minimum reduction.

38. The method of claim 26, wherein scheduling loading is performed such that overall execution time is minimized subject to at least one of an area constraint and an execution time constraint.

39. The method of claim 37, wherein scheduling loading is performed such that each function activation is preceded by loading.

40. The method of claim 37, wherein scheduling loading is performed such that a specified capacity for coexisting groups loaded for a block of an application specific circuit is not exceeded.

41. The method of claim 37, wherein the data structure includes a control flow graph, and wherein scheduling loading comprises:

modeling each group as a task and each available block of an application specific integrated circuit as a processor with a specified maximum number of simultaneous tasks;

for each group activation of which has been successfully scheduled, creating a new load_group task having a finish time equal to a finish time of a task representing the group and having a start time equal to a start time of the task representing the group minus a runtime parameter specifying a time required to load a group.

42. The method of claim 40, wherein scheduling loading further comprises, for each new load_group task, inserting a node into the control flow graph.

43. The method of claim 40, wherein scheduling loading further comprises:

finding a branching node in the control flow graph immediately preceding activation;

calculating a stall time of a load_group task as a finish time of the branching node minus the load_group task start time;

if the stall time is less than or equal to the estimated reduction in execution time for the group, creating a control flow arc from the branching node to the load_group task;

otherwise, discarding the load_group task and discarding the group.

44. The method of claim 41 or claim 42 wherein scheduling loading further comprises running a modified list processing multiprocessor scheduling algorithm.

45. The method of claim 43, wherein running a modified list processing multiprocessor scheduling algorithm comprises:

running a list scheduling multiprocessor scheduling algorithm with a specified maximum number of simultaneous tasks per processor;

during running of the algorithm, in the event no processor is available when a newly-ready task becomes ready:

calculating a stall time until a processor would become available;

create a list of contending tasks including the newly-ready task and tasks scheduled to be executing at a time the newly-ready task becomes ready; and finding a contending task with a minimum estimated reduction in execution time.

46. The method of claim 41, wherein running the modified multiprocessor scheduling algorithm further comprises:

if the stall time is less than or equal to the minimum reduction, scheduling the newly-ready task to execute when a processor becomes available, adjusting the schedule for a corresponding group task and continuing to run the multiprocessor scheduling algorithm.

47. The method of claim 44, wherein running the modified multiprocessor scheduling algorithm further comprises, if the stall time is greater than the minimum reduction, discarding the task with the minimum reduction and its corresponding group and continuing to run the multiprocessor scheduling algorithm.

48. The method of claim 43, wherein running the modified multiprocessor scheduling algorithm further comprises, if in the control flow graph a branching node intervenes between a node representing a discarded load_group task and a node representing activation of the corresponding group:

finding a branching node in the control flow graph immediately preceding activation;

calculating a stall time of a load_group task as a finish time of the branching node minus the load_group task start time;

if the stall time is less than or equal to the estimated reduction in execution time for the group, creating a control flow arc from the branching node to the load_group task;

otherwise, discarding the load group task and discarding the group.

49. The method of claim 46, wherein running the modified multiprocessor scheduling algorithm further comprises, if the stall time is greater than the minimum reduction:

replacing the newly-ready task with two new tasks and corresponding groups, a first new group containing code blocks of the newly-ready task having start times later than when a processor would become available, and a second new group containing other code blocks of the newly-ready task;

replacing respective tasks scheduled to be executing at a time the newly-ready task becomes ready with two new respective tasks and corresponding groups, a first new group containing code blocks of the newly-ready task having start times later than when a processor would become available, and a second new group containing other code blocks of the newly-ready task.

50. The method of claim 48, wherein running the modified multiprocessor scheduling algorithm further comprises:

of the new tasks, finding a task with corresponding group having a minimum reduction in execution time; and discarding the task with the corresponding partition having the minimum reduction.

51. The method of claim 49, wherein running the modified multiprocessor scheduling algorithm further comprises, if in the control flow graph a branching node intervenes between a node representing a discarded load_group task and a node representing activation of the corresponding group:

finding a branching node in the control flow graph immediately preceding activation;

calculating a stall time of a load_group task as a finish time of the branching node minus the load_group task start time;

if the stall time is less than or equal to the estimated reduction in execution time for the group, creating a control flow arc from the branching node to the load_group task;

otherwise, discarding the load group task and discarding the group.

* * * * *